(12) United States Patent
Keller

(10) Patent No.: US 7,523,370 B1
(45) Date of Patent: Apr. 21, 2009

(54) CHANNEL MASKING DURING INTEGRATED CIRCUIT TESTING

(75) Inventor: Brion Keller, Binghamton, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 755 days.

(21) Appl. No.: 10/942,741

(22) Filed: Sep. 15, 2004

Related U.S. Application Data

(60) Provisional application No. 60/503,191, filed on Sep. 15, 2003.

(51) Int. Cl.
*G01R 31/28* (2006.01)

(52) U.S. Cl. ........................ 714/726; 714/729

(58) Field of Classification Search ............. 714/726, 714/729
See application file for complete search history.

(56) References Cited

U.S. PATENT DOCUMENTS

| | | | |
|---|---|---|---|
| 6,557,129 B1 | 4/2003 | Rajski et al. | |
| 6,611,933 B1 | 8/2003 | Koenemann et al. | |
| 6,684,358 B1 | 1/2004 | Rajski et al. | |
| 6,745,359 B2 * | 6/2004 | Nadeau-Dostie | 714/726 |
| 6,901,546 B2 * | 5/2005 | Chu et al. | 714/738 |
| 6,993,694 B1 * | 1/2006 | Kapur et al. | 714/733 |
| 2003/0120988 A1 | 6/2003 | Rajski et al. | |
| 2003/0131298 A1 | 7/2003 | Rajski et al. | |

OTHER PUBLICATIONS

Chickermane rt al., Channel Masking Synthesis for Efficient On-Chip Test Compression, 2004, IEEE, pp. 452-461.*
S. Mitra and K.S. Kim, "X-Compact an Efficient Response Compaction Technique for Test Cost Reduction", Proc. International Test Conference, IEEE, 2002, pp. 311-320.

* cited by examiner

*Primary Examiner*—Cynthia Britt
*Assistant Examiner*—John J Tabone, Jr.
(74) *Attorney, Agent, or Firm*—Vista IP Law Group, LLP.

(57) ABSTRACT

During testing of an integrated circuit (IC), a channel masking capability is used for masking out unknown or unpredictable (X) values from being compressed into a signature register. The approach provides flexibility to allow for masking of unknown values, while avoiding many of the problems caused by over-masking of known values. The circuitry added to the design to allow for masking is reasonably small, and provides an effective way of masking unknown values during the testing process.

42 Claims, 3 Drawing Sheets

Basic channel masking logic

Figure 1. Basic channel masking logic

Figure 2. Example showing 2 mask registers and a mask-all-channels capability

CHANNEL MASKING DURING INTEGRATED CIRCUIT TESTING

CROSS-REFERENCED AND RELATED APPLICATIONS

This application claims the benefit of U.S. Provisional Application 60/503,191, filed on Sep. 15, 2003 which is hereby incorporated by reference as if fully set forth herein.

BACKGROUND OF THE INVENTION

Compression of test pattern response data into signatures is a well-established technique that has been used for decades, especially for logic built-in self-test (LBIST). More recently, it has been used as part of a more general approach for test data compression, in order to save data volume and test time.

One problem with compressing test responses into signatures is dealing with circuits that produce unknown responses. An unknown response, if allowed to be captured into a signature register, will re-circulate, quickly making the final signature unpredictable. If just a single unknown value is captured, it is possible to predict two possible signatures, either of which could be assumed to be a non-defective response. However, when multiple unknown values are captured into a signature, the number of possible good signatures grows exponentially, and it quickly becomes impractical to predict all possible good response signatures.

One approach to dealing with unknown response values is to prevent the unknown values from being captured into the signature registers. One way of doing this is to provide a mechanism to mask out the unknown values before they are captured into the signature registers.

However, the conventional methods lack the capability to mask out the specific channel bits containing unpredictable or unknown values. Without this flexibility, predictable values may be unnecessarily masked, in order to ensure the masking of the unpredictable values. When masking out the predictable values, over-masking occurs, and reduces the effectiveness of the test patterns. For example, faults targeted by the test patterns may not be detected if the channel bit used to observe the fault's effect is masked due to over-masking.

SUMMARY OF THE INVENTION

During testing of an integrated circuit (IC), a channel masking capability is used for masking out unknown or unpredictable (X) values from being compressed into a signature register. The approach provides flexibility to allow for masking of unknown values, while avoiding many of the problems caused by over-masking of known values. The circuitry added to the design to allow for masking is reasonably small, and provides an effective way of masking unknown values during the testing process.

A method of channel masking during integrated circuit testing includes inputting a scan chain test vector into an integrated circuit, outputting a scan chain response vector from the integrated circuit, the response vector comprising predicted values and unpredictable values, and selectively masking the response vector for each scan cycle based on a location of the unpredictable values.

DETAILED DESCRIPTION

Figure 1:
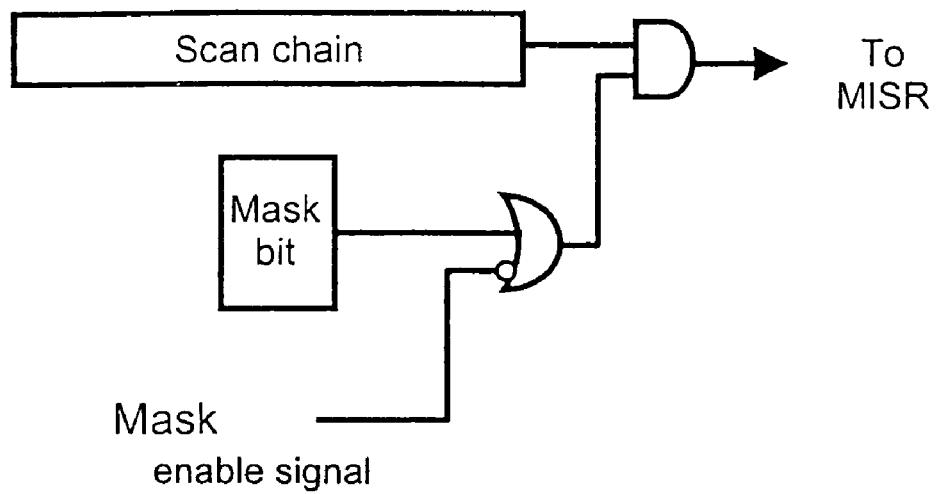
FIG. 1 shows an example of an apparatus for channel masking.

An integrated circuit whose scan chains, or channels, scan into a signature register, such as a multiple-input signature register (MISR) for example, during testing, uses a channel masking apparatus and method for masking unknown values that appear in response data when automatic test pattern generation test vectors are applied to the circuit, while minimizing the over-masking of known values. The channel masking method allows for multiple channel mask registers; provides an ability to load channel mask registers prior to scanning out the responses for a single test, so that each test can use an independent mask register state; and provides an ability to re-load the channel mask registers multiple times during the same scan-out process.

The channel mask registers may be loaded from a test bus of the scan-in pins, which can also be used to observe MISRs by making them bidirectional. The mask registers can be scan-loaded from this test bus either by using a scan clock separate from the main logic scan clocks, or by asserting a mask-loading circuit state that switches a core logic scan clock to become a mask loading scan clock.

The channel masking method may select a reasonably optimal set of values to load into the mask registers. Channel mask enable signals are used for selecting either a mask register from several mask registers, masking all channels, or for providing no masking, on a scan-cycle by scan-cycle basis. The ability to select the appropriate mask enable signal setting on an individual scan cycle basis may be provided by controlling these signals directly from device pins that are connected to tester scan pins, or by controlling these signals from test vector decompression logic.

When the mask enable signals are controlled from scan pins independent of the logic scan chain scan pins, it is possible to keep the test patterns independent from each other such that they may be reordered into a more optional sequence for manufacturing tests.

When the mask enable signals are controlled from vector decompression logic, the masking of responses from one test is controlled by the scan-in stimulus for the next test. The two streams of control data become intermingled. As a result, the order of the tests may be changed in this case by re-computing the test stimulus, which may alter the tests so significantly that they may no longer be the same. The masking method may also share mask bits between different channels, balancing the ability to reduce over-masking with an ability to reduce mask logic overhead.

A channel masking test re-ordering mechanism allows signatures to be used even if the tests are re-ordered. This mechanism is used to allow sorting of test vectors, to ensure a more optimal test application order, which can often help to reduce test costs by detecting most defective devices relatively soon. This allows the ATE to move on to the next device sooner than would otherwise be possible. This mechanism may be used when the mask enable signals are controlled directly from scan inputs.

A channel masking method provides the ability for automatic test pattern generation (ATPG) software to understand the channel masking logic, and to avoid the masking of scan bits being used to detect faults in the current test. This includes knowing when channels share a common mask bit. The ATPG software may understand when certain scan bits may become unpredictable due to a number of reasons, including: un-initialized RAMs, latches or other non-scan memory elements; un-terminated three-state logic that is in a high impedance state; observation of switching paths that do not meet timing for an at-speed delay test; and user-specified unpredictable responses.

These identified bits may capture an unpredictable value on some tests, but the automatic test pattern generation software may also force a predictable value to be captured in those bits. The software will attempt to force predictable values into those bits whenever not doing so might result in the masking of a detected fault.

To provide channel masking, a single mask enable signal may gate channel outputs directly. This is called a "mask-all" capability. When the mask enable is not asserted, the channels feed into the MISR (or off chip), and no masking occurs. When the mask enable is asserted, all channel outputs are blocked from feeding into the MISR (or off chip); a constant value feeds forward instead, and all channels are masked.

Alternatively, one or more mask registers may be used to mask the scan-out data prior to capturing the data into the signature register. In an embodiment as shown in FIG. 1, the mask signal enables the use of the mask register during logic testing. In this configuration, a single mask enable signal is used to enable mask register bits to cause gating of each channel's output. When mask enable is not asserted, the channel outputs flow freely. When mask enable is asserted, individual (or shared) mask bits can gate off or not each channel's output.

For example, when the mask signal equals 0, no masking is performed, and the scan chains send their data into the signature register unmodified. When the mask signal equals 1, some scan chains may still send their data into the signature register, while others may be blocked (masked), depending on the values of the bits (previously) loaded into the mask register bits. In the example shown in FIG. 1, a mask register bit value of 1 would allow the scan chain data to flow into the signature register, while a mask bit value of 0 would force a 0 into the signature, regardless of the scan chain output value.

The setting of the mask signal can be changed for each scan cycle, allowing the mask register to be applied to only those scan cycles in which an unknown value would be appearing at the output of one or more scan chains. With a single mask register loaded once per test vector, the register is used to mask out an unknown X value for the scan chains in which an X response appears during that testing with the test vector. For example, for each scan chain that observes at least one X, the mask register is loaded such that when the mask signal is set to logic 1, the output of these chains, or channels, are masked.

This may result in known values being masked from some scan chains on scan cycles when another scan chain is emitting an X. This over-masking can be reduced or completely eliminated by re-loading the mask register multiple times during the scanning of the test vector. In this example, there may be an efficiency trade-off between over-masking and the time it takes to load the mask register multiple times in order to reduce or eliminate over-masking.

Figure 2:
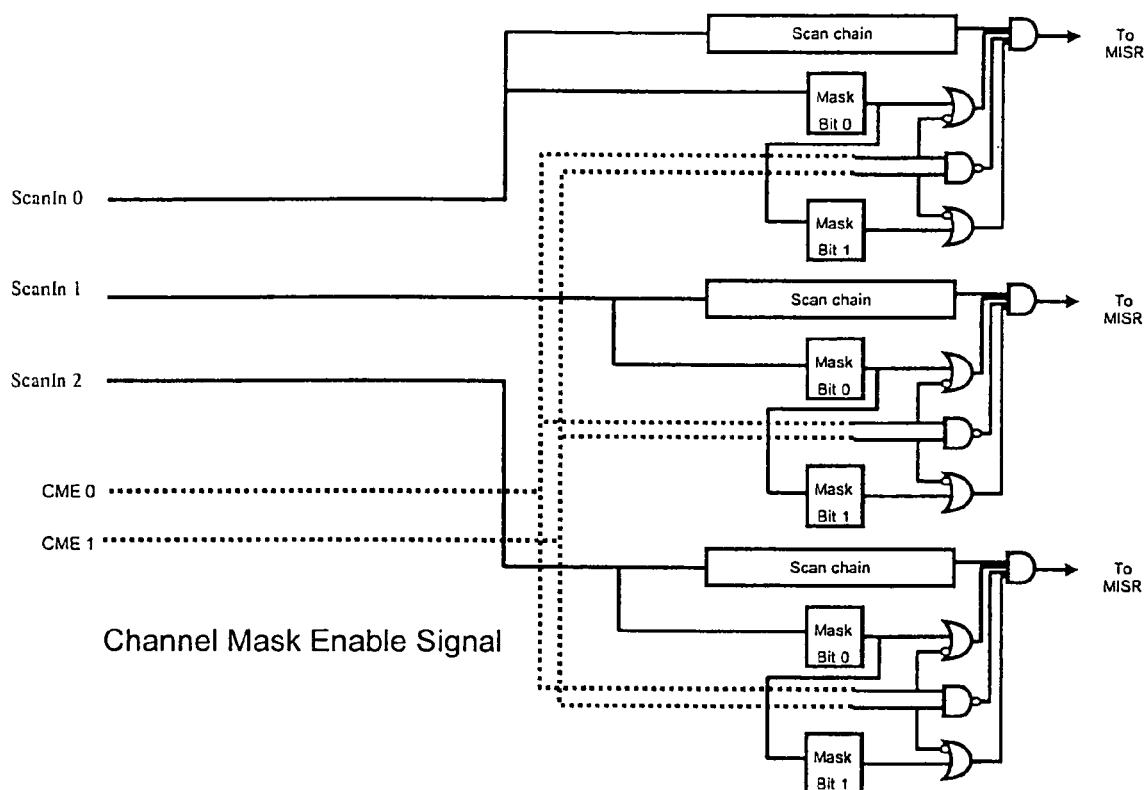
FIG. 2 shows another example of an apparatus for channel masking.

Another solution is to increase the number of mask registers, and to select which register to apply on each scan cycle, as shown in FIG. 2. In this configuration, two mask enable signals are used. The encoded state of these two signals determines what will happen on each scan cycle. For example, when both mask enable signals are not asserted, no channels are masked. When one or the other mask enable signal is asserted, one of the two mask registers is selected to establish the masking. When both mask enable signals are asserted, all channels are masked. This configuration combines multiple mask registers with a mask-all capability.

The example in FIG. 2 shows three scan chains, along with two channel-mask registers, which are provided for masking. There are two channel-mask-enable (CME) signals which are used to encode the selection on a scan cycle by scan cycle basis. The encoded enable signals select from: no masking, select mask register one, select mask register two, or mask all channels. The mask selection signals, denoted as CME0 and CME1 in FIG. 2, are driven by the Automatic Test Equipment (ATE), and may change on each scan cycle. The signals may appear to be additional scan-inputs from the perspective of the ATE. A single loading of the mask registers before the scan-out operation begins may produce less over-masking. Also, the mask registers may be re-loaded multiple times during a single test's scan-out operation.

FIG. 2 also shows that multiple mask register bits may be loaded by linking them into scan chains connected to the scan-in pins. When test data compression schemes are in use, the number of internal scan chains may be many times the number of scan-in pins. In such cases, the mask register bits may use several cycles in order to be completely loaded.

The overhead for the masking logic may also be reduced by sharing single mask register bits among several channels. This reduces both the number of mask bits to be physically implemented, as well as reduces the number of mask bits to be loaded for each test. For example, if each mask bit masks eight channels, then overhead may be reduced by a factor of eight.

The trade-off for the sharing of masking bits is that there may be over-masking of known scan data whenever any of the channels sharing a mask bit needs to be masked out. However, having the flexibility to share mask bits provides another option to be considered when deciding what logic to include in a total test compression scheme. For example, scan chains which may produce a large number of unpredictable response values could be allocated their own independent mask register bits, while scan chains which produce very few or no unpredictable values could share a mask register bit with little penalty, since over-masking would occur very infrequently.

Another example of a mechanism that can make the masking utilized efficiently is an Automatic Test Pattern Generation (ATPG) computer-implemented method, which is aware of the masking logic, to avoid over-masking of the scan bit that was used to detect a target fault. If the ATPG computer-implemented method is aware of both how the masking logic works (e.g., whether there is sharing of mask bits among channels), and of which scan bits may observe an unknown (x) value, then the ATPG implemented method can create test vectors that ensure unknown values are not seen at any scan bits that would cause the over-masking of a target fault's observe scan bit.

The flexibility of this approach is seen when considering, for example, what occurs when a path-delay test is created in which all scan bits predict an unknown (x) value except for the scan bit which observes the output of the path being tested. In such a case, only a single known value is to be captured into the signature for the test. The scan bits in the other channels and the other scan bits within the channel containing the capturing scan bit are ignored. To do this, the masking is switched on and off on a per-scan-cycle basis. In this example, for all scan cycles prior to and after the cycle that observes the path output bit, all channels could be masked out using either a mask-all or a mask register. On the cycle in which the path output bit is shifted out, a mask register is selected that masks all channels except the one which has the path observation bit.

In the case where masking bits are being shared, the ATPG software implemented method ensures that any channel masked by the same mask register bit as the channel used to observe a fault or a path produces predictable values to avoid masking out the fault or path detection. For path delay tests, the other scan chain bits would be forced to observe no transitions so that they could be predictable regardless of the timing applied to stress the original target path.

When deciding how to load the mask registers, a mask computation method is applied to provide a reasonably optimal utilization of the channel mask register resources that are available. The method may do this by using information passed along from ATPG software that identifies which scan bits are being used to detect target faults for individual test vectors. This information may be accumulated when multiple tests are merged together as part of test vector compaction algorithms.

The mask computation method may achieve its result by considering which scan bits are being used to detect faults; the number of mask registers that are available; whether there is a mask-all capability available (e.g., one of the encoded states of a set of mask-enable signals); and whether the mask registers should be loaded only once per test, or if it is acceptable to re-load the mask registers additional times if that improves the masking efficiency, for example.

When not given the ability to re-load the mask registers, the mask loading method may avoid a condition in which a target fault's detection is missed due to over-masking. This is accomplished by identifying scan cycles which include a large number of target fault detections and in which an X needs to be masked from one or more channels, as well as those scan chains which contain the most target fault detections. The list of scan cycles requiring masking is then sorted based on how many target faults are being detected on those cycles. The masking used to protect the bits for detecting target faults may be determined by starting with the cycle that detects the most target faults, down to the cycle that detects the least, or no, target faults.

When analyzing a scan cycle, a determination of whether any of the current mask register contents would be sufficient to mask out X values on this scan cycle is made. If more than one mask register could be effective, the register that masks fewer detect bits may be selected. If only one register is effective, this register is used, unless it would mask out a target fault. If so, then a calculation is made to determine whether adding a new mask bit to another mask register will cause more or less masking of target fault detections. The least costly result of this calculation is selected. This may not provide the optimal mask register values and uses, but it does provide a reasonable approximation of an optimal setting, without consuming a large amount of CPU time to consider all possible mask register settings to locate the true optimal values to use. For scan cycles that produce an x but detect no target faults, either an existing mask register, or mask-all if available, may be used.

Figure 3:
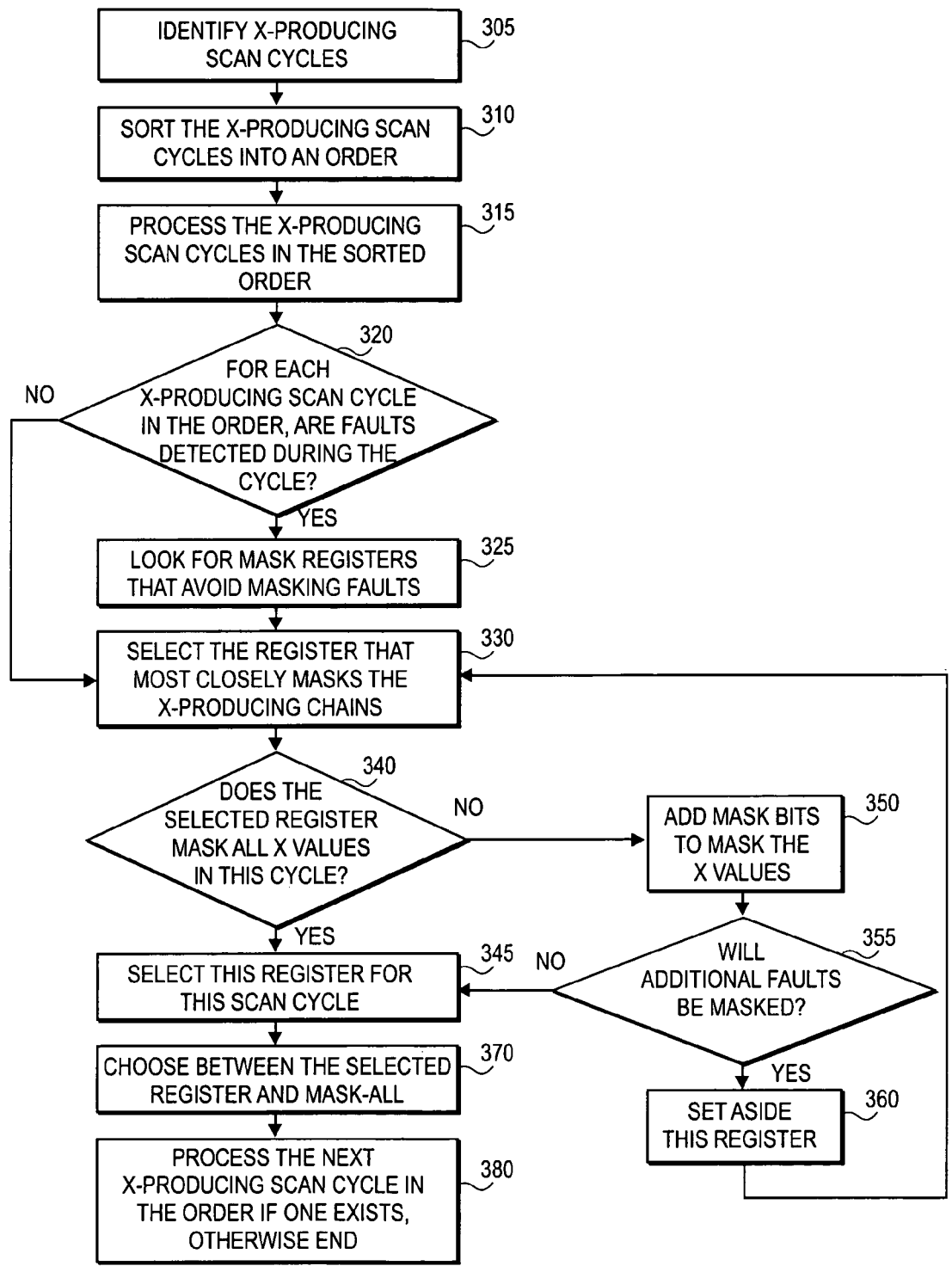
FIG. 3 shows an example of a method for channel masking.

An example of a process used to compute the mask register values when loading them only once per test (just before unloading the scan chains) is shown in FIG. 3. Identify scan cycles in which an X value will appear on the output of at least one scan chain, 305. The values may be provided by simulating the tests to determine response values loaded in the scan chains. Sort the identified X-producing scan cycles by the number of ATPG targeted fault detects that would occur in non-X producing scan chains on those same scan cycles, 310. Process the X-producing scan cycles in order of those that detect the most targeted faults down to those that detect the least (perhaps zero) targeted faults, 315.

Determine if there are faults detected in the currently selected scan cycle, 320, and, if so, look for one or more available mask registers that will not mask out any scan chains that detect faults in this scan cycle, 325. If multiple registers are available, then select the register that most closely masks the X-producing chains, 330. Determine if the selected register would mask all of the X values produced in this scan cycle, 340. If so, then select this mask register to be used on this scan cycle, 345. The method may then process the next scan cycle in the sorted order, 380. Before performing 380, the method may choose between the selected register and mask-all, 370.

Otherwise, add mask bits necessary to ensure that Xs produced by this scan cycle will be masked out as a possible new state for this mask register, 350. Check the scan cycles in which this mask register was (previously) selected to be used to see if there are any target fault detects that would now be masked due to the addition of new scan chains being masked out, 355. If no additional faults would be masked out, keep this new mask register setting, select this mask register to be used on this scan cycle, 345, choose between the register and mask-all, 370, and process the next cycle, 380. Otherwise, if there are additional mask register choices available, set aside this possible mask register setting, 360, and select another register, 330.

If there are multiple mask registers to choose from and they each would mask out some additional fault detects, choose the mask register that would cause the least masked out faults, or, choose to mask-all scan chains in this scan cycle if that capability is available and if that would produce fewer faults being masked out, 370.

When scan cycles that detect no faults are processed, 320, it is possible to use a mask-all for such cycles unless a mask register can mask the Xs on that cycle without the addition of new bits to the mask register that would cause masking of faults on other cycles which also use that mask register. When possible, the mask registers may be used instead of the mask-all, so that at least some non-X values can be seen from scan chains on those cycles. This is useful since many faults are detected by accident and are not targeted by ATPG. Every non-X scan bit contains a potential accidental fault detect. Also note that when there are multiple mask registers available, when neither mask register is currently set to correctly mask out the Xs from the current scan cycle, these mask registers are evaluated to see which one would cause the least masking of additional fault detects and that register is selected.

One capability of ATPG is the ability to allow tests to be sorted or otherwise rearranged into a more optimal ordering. Often the optimal ordering of tests may not be known until experience is gained in testing real devices under real manufacturing test conditions. Since the ability to reorder tests is a desired capability, the method includes the capability to ensure that stimulus and signatures can continue to be used even if the tests are rearranged.

If signatures are reused when the test application order is changed, scan-stimulus data from the next test may overflow short scan chains and get into the prior test's signature. This is caused by overlapping the scan-out into the MISR of the results of a test while simultaneously scanning in the stimulus data for the next test. (Overlapping tests are used to avoid doubling the test time). This is handled by computing each signature under the premise that the scan-in stimulus will be a constant of zeros when unloading the responses of a test into the signature registers. A second component, or fix-up, of each signature is then associated with each test's stimulus data. A determination of whether that would cause a signature to be different is made. (This different signature may occur if some of the scan-data that overflows the short scan chains was in fact not all zeros). This second component of each signature is based on which test is actually applied following the current test. If this information is passed along in the test data to the ATE software, the tests can even be reordered post ATPG, and the correct signatures can be computed by XOR-ing the signature's second component with the original signature data.

When masking is applied on scan cycles in which new stimulus data could be overflowing from a channel that could be being masked, the signature's second component data may no longer be valid. The masking is associated with the response data, and the second component is associated with a completely independent test. Therefore, whether the mask operation could occur on a short channel output during scan cycles in which new stimulus data could overflow is considered. When, this is detected, the scan length is artificially increased by pre-padding the next test with zeros on all scan-in pins until it is ensured that masking no longer can occur, such that new scan stimulus data can be masked out. Because this only affects the scanning-out process, the signature fix-up process works regardless of how many additional padding cycles are actually used on any given test.

The channel masking may be used to provide no masking, masking based on a selected mask register, or masking all channels. The multiple registers use multiple mask enable signals that encode on a scan cycle basis. The more mask registers that are implemented, the more mask enable signals are used to encode their selection. While there may be no conceptual limit to the number of mask registers that can be implemented and supported, practical considerations may limit the number of mask registers to a relatively small number. For example, for designs with just a few x values, a single mask register may be sufficient. For those with modest amounts of x values, two mask registers plus a mask-all may be appropriate. In cases where there are many x values, one or two mask registers plus the ability to re-load them within a single scan operation may be appropriate.

The mask registers can further be used for logic BIST in the event that certain scan chains have timing problems and cannot produce reliable/predictable results. It is also possible to use channel mask registers to aid in diagnostics, by performing a binary search to locate the failing channel or channels. The binary search is done by alternately masking off half the remaining suspect channels, and then the other half, to see which half produces unexpected results. The bad half can then be further bisected until a single channel is located to explain the failure. If multiple channels are at fault, multiple sets of bad channels may be considered and bisected independently.

As described above, the mask enable signals may be fed directly from tester scan channels. An alternative approach that trades off complete control of the masking logic per cycle is to have the mask enable signals controlled from test-vector decompression logic such that the mask enabling is intermixed and merged with the scan stimulus data for the next test vector. For example, the smartBIST style of test decompression logic could feed the mask enable signals as if they were additional scan chain inputs. This may be appropriate when either the number of x values needing to be masked is low, or if there are sufficient scan-in pin resources such that the mask control signals can be forced to values for scan cycles that either have x values to be mask, or that detect faults from channels that could be masked by accident if the control is not direct.

If the mask enable signals are driven from the outputs of test vector decompression logic, the ability to reorder the tests post-ATPG may be eliminated, since the masking data for one test becomes intermingled with the stimulus for the following test. However, even when using the test vector decompression logic to drive the mask enable signals, the channel masking method may still reorder tests within the ATPG system allowing the compressed stimulus and response data to be recomputed.

The channel masking apparatus provides multiple mask registers and additional mask enable signals to allow encoding of the additional register selection codes. For example, with 3 mask enable signals, up to six mask registers and a mask-all may be supported, which, when the no-masking state is added, yields 8 total states, which is what a binary encoding of three signals provides. Similarly, four mask enable signals would support a total of up to 14 mask registers as well as mask-all and mask-none states.

In these cases, the mask register bits can be loaded by scanning into them from the scan-in pins. For most test compression logic cases, there are many more internal scan chains than there are scan-in pins, so it is reasonable that it will often require multiple bits to be scanned in from each scan-in pin to completely load the mask register scan chains.

By sharing individual mask register bits among several channels it is possible to reduce the scan depth needed to load the mask registers. In the extreme, it becomes possible to load a single mask register in a single scan cycle when each mask bit is shared across as many channels as the scan-in pins are shared by the test compression logic. The penalty for such sharing of mask bits is that several channels must be masked together. As long as ATPG knows of this, it is possible to reduce the chances of over-masking causing problems by insuring that all target faults are detected on scan cycles in which all other channels that share the same mask bits will not produce an x value during that scan cycle.

The mask enable signals can be fed directly from device pins. These pins would be driven by tester pins as if they were scan-in pins, allowing the mask enable signals to change on each scan cycle. For designs that may exhibit a large number of x values, this configuration would be the preferred embodiment for control of the mask enable signals. Alternatively, when using test vector decompression logic, the mask enable signals can be fed from the additional outputs of the decompression logic. In such configurations, sorting of the test vectors into a more optimal ordering will be very difficult if not impossible.

I claim:

1. A method, comprising:
   inputting a scan chain test vector into an integrated circuit;
   outputting a scan chain response vector from the integrated circuit, the response vector comprising predicted values and unpredictable values; and
   selectively masking the response vector for each scan cycle based on a location of the unpredictable values by adding mask register bits to a mask register to mask the unpredictable values, wherein an action of adding the mask register bits to the mask register is based at least in part upon a result of determining whether a result of adding the mask register bits causes more or less masking of target fault detection, and the mask register does not mask all the unpredictable values.

2. The method of claim 1, wherein outputting the scan chain response vector further comprises:
   outputting the response vector from a plurality of channels.

3. The method of claim 2, further comprising:
   selectively masking one or more channels of the plurality of channels based on channels containing unpredictable values.

4. The method of claim 3, wherein selectively masking one or more channels further comprises:

associating each channel with a mask register bit, a plurality of mask register bits comprise a mask register, the plurality of mask register bits in the mask register being enabled together.

5. The method of claim 4, wherein each channel is associated with an individual mask register bit.

6. The method of claim 4, wherein two or more channels share a mask register bit.

7. The method of claim 4 wherein each mask register can select to mask a different channel subset.

8. The method of claim 7, wherein the subset can include all channels.

9. The method of claim 7, wherein selectively masking the one or more channels on a specific scan cycle further comprises:
applying a state on a set of one or more channel mask enable signals to select none or one of one or more mask registers; and
gating the response vector for the current scan cycle channel outputs with the selected mask register's bits such that for mask register bits set to a mask-out value, corresponding channel output values are replaced by a constant value.

10. The method of claim 9, further comprising:
loading the mask registers with the selectively masked mask register bits.

11. The method of claim 10, further comprising:
re-loading the mask registers multiple times during testing.

12. The method of claim 7, wherein each mask register is enabled by an encoding of states on a set of mask enable signals.

13. The method of claim 12, wherein one of the encodings of states on the set of mask enable signals is reserved to perform no masking.

14. The method of claim 12, wherein one of the encodings of states on the set of mask enable signals is reserved to use a pre-defined constant that never needs to be loaded, the pre-defined constant can mask all or mask a subset of channels.

15. The method of claim 1, wherein selectively masking further comprises:
avoiding masking of fault detection portions of the response vector.

16. The method of claim 1, further comprising:
determining whether the result of adding mask bits masks a pre-detected target fault.

17. An apparatus, comprising:
means for inputting a scan chain test vector into an integrated circuit;
means for outputting a scan chain response vector from the integrated circuit, the response vector comprising predicted values and unpredictable values; and
means for selectively masking the response vector for each scan cycle based on a location of the unpredictable values by adding mask register bits to a mask register to mask the unpredictable values, wherein an action of adding the mask register bits to the mask resister is based at least in part upon a result of determining whether a result of adding the mask register bits causes more or less masking of target fault detection, and the mask register does not mask all the unpredictable values.

18. The apparatus of claim 17, wherein outputting the scan chain response vector further comprises:
means for outputting the response vector from a plurality of channels.

19. The apparatus of claim 18, further comprising:
means for selectively masking one or more channels of the plurality of channels based on channels containing unpredictable values.

20. The apparatus of claim 19, wherein selectively masking one or more channels further comprises:
means for associating each channel with a mask register bit, a plurality of mask register bits comprise a mask register, the plurality of mask register bits in the mask register being enabled together.

21. The apparatus of claim 20, wherein each channel is associated with an individual mask register bit.

22. The apparatus of claim 20, wherein two or more channels share a mask register bit.

23. The apparatus of claim 20 wherein each mask register can select to mask a different channel subset.

24. The apparatus of claim 23, wherein each mask register is enabled by an encoding of states on a set of mask enable signals.

25. The apparatus of claim 23, wherein the subset can include all channels.

26. The apparatus of claim 24, wherein one of the encodings of states on the set of mask enable signals is reserved to perform no masking.

27. The apparatus of claim 24, wherein one of the encodings of states on the set of mask enable signals is reserved to use a pre-defined constant that never needs to be loaded, the pre-defined constant can mask all or mask a subset of channels.

28. The apparatus of claim 24, wherein the means for selectively masking the one or more channels on a specific scan cycle further comprises:
means for applying a state on a set of one or more channel mask enable signals to select none or one of one or more mask registers; and
means for gating the response vector for the current scan cycle channel outputs with the selected mask register such that for mask register bits set to a mask-out value, the corresponding channel output values are replaced by a constant value.

29. The apparatus of claim 28, further comprising:
means for loading the mask registers with die selectively masked mask register bits.

30. The apparatus of claim 29, further comprising:
means for re-loading the mask registers multiple times during testing.

31. The apparatus of claim 17, wherein selectively masking further comprises:
means for avoiding masking of fault detection portions of the response vector.

32. A method, comprising:
inputting a scan chain test vector into an integrated circuit;
outputting a scan chain response vector from the integrated circuit, the response vector comprising predicted values and unpredictable values;
sorting scan cycles to process a first scan cycle with more targeted faults earlier than a second scan cycle with less targeted faults; and
selectively masking the response vector for each scan cycle based on a location of the unpredictable values based at least in part upon a result of whether selectively masking the response vector causes more or less masking of target fault detection.

33. The method of claim 32, wherein the mask registers can be re-loaded multiple times during the same scan cycle.

34. The method of claim 32, wherein the mask registers can be loaded using a clock separate from the main logic clock.

35. The method of claim 32, wherein the steps of the method are performed by automatic test pattern generation software.

36. The method of claim 32, wherein outputting the scan chain response vector further comprises:
   outputting the response vector from a plurality of channels.

37. The method of claim 36, wherein the subset can include all channels.

38. The method of claim 32, wherein two or more channels share a mask register.

39. The method of claim 32, wherein each mask register is enabled by an encoding of states on a set of mask enable signals.

40. The method of claim 39, wherein one of the encodings of states on the set of mask enable signals is reserved to perform no masking.

41. The method of claim 39, wherein one of the encodings of states on the set of mask enable signals is reserved to use a pre-defined constant that never needs to be loaded, the pre-defined constant can mask all or mask a subset of channels.

42. An apparatus, comprising:
   means for inputting a scan chain test vector into an integrated circuit;
   means for outputting a scan chain response vector from the integrated circuit, the response vector comprising predicted values and unpredictable values;
   means for sorting the scan cycles to process a first scan cycle with more targeted faults earlier than a second scan cycle with less targeted faults; and
   means for selectively masking the response vector for each scan cycle based on a location of the unpredictable values based at least in part upon a result of whether selectively masking the response vector causes more or less masking of target fault detection.

* * * * *